US008138522B2

(12) United States Patent
Schimmel et al.

(10) Patent No.: US 8,138,522 B2
(45) Date of Patent: Mar. 20, 2012

(54) GATE CONTROLLED ATOMIC SWITCH

(76) Inventors: Thomas Schimmel, Karlsruhe (DE);
Fangqing Xie, Karlsruhe (DE);
Christian Obermair, Kapsweyer (DE)

( * ) Notice: Subject to any disclaimer, the term of this patent is extended or adjusted under 35 U.S.C. 154(b) by 0 days.

(21) Appl. No.: 13/158,023

(22) Filed: Jun. 10, 2011

(65) Prior Publication Data

US 2011/0241067 A1    Oct. 6, 2011

Related U.S. Application Data

(63) Continuation of application No. 11/991,391, filed as application No. PCT/DE2005/001541 on Sep. 2, 2005, now Pat. No. 7,960,217.

(30) Foreign Application Priority Data

Sep. 8, 2004   (DE) .......................... 10 2004 043 811

(51) Int. Cl.
*H01L 51/05*    (2006.01)
*H01L 29/76*    (2006.01)
(52) U.S. Cl. ........................................ 257/119; 438/134
(58) Field of Classification Search .......... 257/107–119, 257/133, 168, E21.41; 438/133–139
See application file for complete search history.

(56) References Cited

U.S. PATENT DOCUMENTS 7,960,217 B2 *   6/2011   Schimmel et al. ............ 438/134

OTHER PUBLICATIONS

F. Xie, C. Obermair, T. Schimmel, Solid State Communication, vol. 132 (2004) pp. 437-442.*

* cited by examiner

*Primary Examiner* — Calvin Lee
(74) *Attorney, Agent, or Firm* — McAndrews, Held & Malloy Ltd.

(57) ABSTRACT

The invention relates to a method for producing a switch element. The invention is characterized in that the switch element comprises three electrodes that are located in an electrolyte, two of which (source electrode and drain electrode) are interconnected by a bridge consisting of one or more atoms that can be reversibly opened and closed. The opening and closing of said contact between the source and drain electrodes can be controlled by the potential that is applied to the third electrode (gate electrode). The switch element is produced by the repeated application of potential cycles between the gate electrode and the source or drain electrode. The potential is increased and reduced during the potential cycles until the conductance between the source and drain electrode can be switched back and forth between two conductances, as a result of said change in potential in the gate electrode, as a reproducible function of the voltage of the gate electrode.

7 Claims, 4 Drawing Sheets

GATE CONTROLLED ATOMIC SWITCH

RELATED APPLICATIONS

Figure 1:
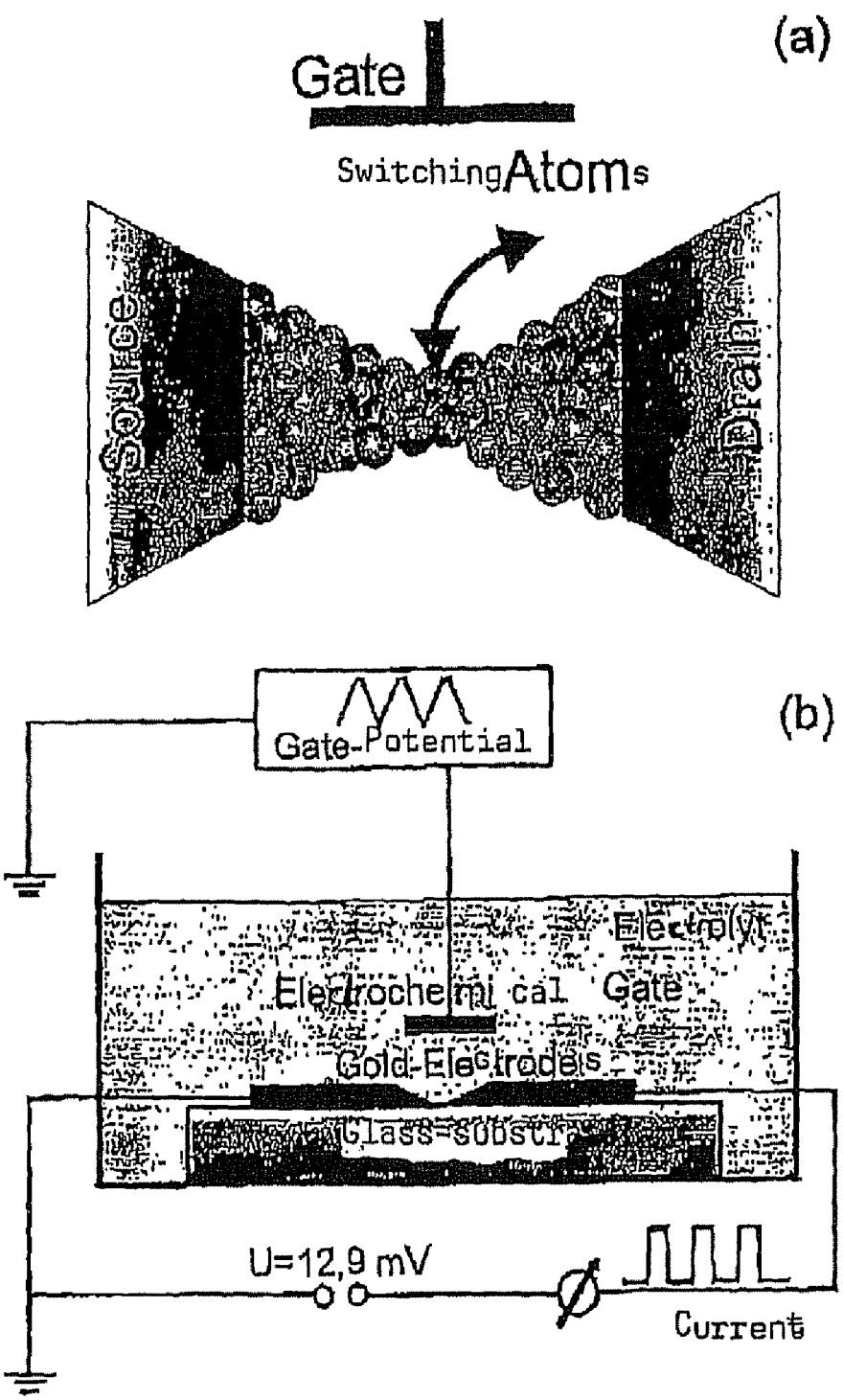

This application is a continuation of U.S. application Ser. No. 11/991391 which is International Application PCT/DE2005/001541, which claims priority to German Application No. 10 2004 043 811.0, all of which applications are incorporated herein by reference.

FEDERALLY SPONSORED RESEARCH OR DEVELOPMENT

Not Applicable

MICROFICHE/COPYRIGHT REFERENCE

Not Applicable

STATE OF THE ART AND PRESENTATION OF THE PROBLEM

The development in microelectronics is characterized by an increasing miniaturization. In addition to a miniaturization of dimensions of individual components, in particular of transistors and the transition to increasing frequencies [1, 2] also the reduction of energy consumption per logic operation comes increasingly to the fore. In semiconductor structures of processors and memory chips which are nowadays produced the dimensions of the individual components of a microchip are already less than 100 nanometers with the purpose of further miniaturization. While the semiconductor technology is still based on silicon based systems to a large extent, for nanoscale-electronics alternative systems are also discussed more frequently, in particular the design of logic elements such as switches and transistors based on individual molecules (so-called molecular electronics) [3, 4, 5].

There has been hardly any discussion on the possibility of the design of electronic circuits based on components, the active structural unit of which are not individual molecular structures (partly special and partly complex), but individual atoms, for example metal atoms ("atomic electronics"). While in the case of molecular electronics there are a large number of proposed concepts but also of experimental implementations already available, there is not yet a concept for atomic electronics. While passive components such as capacitors and resistors on an atomic scale have been implemented and investigated experimentally as prototypes for a long time, atomic electronics has failed so far on the implementation of an atomic transistor, i.e. a component on an atomic scale, in which a source-drain resistance specifically will be controlled by an independent third electrode, the gate electrode, and for instance can be specifically controlled/switched by means of the variation of a potential applied on the gate electrode between an electrically conducting on-state and a electrically less conducting or ideally non-conducting off-state.

On the other side, considerable preliminary research has already been done on the fabrication of contacts between individual atoms [6, 7, 8, 9, 10, 11, 12], which is achieved in a mechanical way, whereby thin metallic bridges will be stretched out to such an extent that the contact area will be made up of a single or a few atoms in diameter. In this process, in particular mechanically controllable break contacts (Mechanically Controllable Break Junctions, MCB) and the contact between the metallic tip of a scanning tunnel microscope and a metallic sample have been used, but also contacts in relays and others have been investigated. It could also been demonstrated that metallic point contacts on an atomic scale can be established by means of galvanic deposition of metals from an electrolyte into a small gap between two electrically conducting contacts [10, 11, 12]. While such contacts frequently but not always turn out to be quantum point contacts having conductance values of integer multiples of the conductance quantum, their conductance values, which they adapt, can hardly be predetermined or adjusted beforehand on a predefined value. In fact, the conductance value of the metallic bridge is decreasing when its diameter is decreasing successively, mostly in several stages, until the bridge is breaking. The essential problem of the implementation of atomic or molecular electronics, i.e. the implementation of active components which made it possible by means of an independent third control electrode to control and adjust specifically the conductance value between source and drain electrode, is not yet solved therewith.

In the past there had been two approaches for solving this problem. As for one approach, an atomic contact was repeatedly opened and closed while two macroscopic electrodes were moved towards one another and afterwards moved away from another [13]. In this process without any doubt the contact on an atomic scale was established, however, the opening and closing of the contact required the movement of a macroscopic electrode.

As for the second approach, the group of Don Eigler [14] succeeded in switching the position of a single atom in a tunneling microscope between two positions (on the tip of the tunnel and on the surface of the sample). In this case there is a component the only movable or moved part of which is a single atom. This atom flip-flop has not only the disadvantage that it operates in the shown configuration only at low temperatures (typically at 4 K up to 30 K) and in ultra high vacuum, that is, not under conditions where in technical applications electronic relays operate. Moreover, there is also no independent third electrode as a control electrode or gate available, instead the switching of the atom position of the movable atom is achieved by applying a potential to both electrodes the conductance value of which has to be switched. However, first and foremost, this arrangement does not allow to open and close an electrical circuit, but the resistance of the contact typically varies between 0% and 40% due to the switching of the position of the atom, whereby this percentage of variation cannot be predicted exactly.

A different relay element has been described by Fuchs and Schimmel [15, 16] with a switching process on an atomic scale. Unlike the above described device, in this element the switching process can also be carried out under ambient conditions, i.e. at room temperature and in air, i.e. without the necessity of vacuum or exclusion of oxygen. However, there is mainly a positional switching. Switching of an electrical tunnel current between a higher and a lower value can also only be observed if a tunnelling microscope is used. The tunnel current cannot be switched on and off by means of the atomic element.

EXPLANATION OF THE PROCEDURE AND OF THE COMPONENT ACCORDING TO THE INVENTION

By the procedure according to the invention this problem is solved as a atomic switching element has been designed, the only moveable elements of which are the contacting atoms and the electrical contact of which between two electrodes (which are called source and drain) can be specifically opened and closed by means of an potential which is applied to an independent third electrode (control potential). This component operates at room temperature and without exclusion of oxygen. The ratio of the source drain-conductance in the on and off-state can be more than 1000, and according to the embodiment more than 10,000.

The fundamental idea of the process according to the invention is the training of an electrochemically produced atomic point contact by repeated cycling in the following manner:

At first in a small gap between two electrodes metal will be deposited galvanically from an electrolyte until the contact between both of the electrodes is closed and a pre-adjusted upper conductance value is exceeded. Afterwards immediately or after a defined delay a dissolution potential V2 will be applied to both of the electrodes with respect to the reference electrode (it may be but need not be carried out, for instance, not be varying the potential of both of the gold electrodes, but through varying the potential of the quasi reference electrode with respect to a reference potential "ground"), until the conductance value falls short of a lower conductance value Y, and then a deposition potential V1t will be applied again until in the contact the upper conductance value is reached and the cycle of applying the dissolution potential V2 starts again.

This procedure will be repeated until by this training of the contact as a response to applying a dissolution potential to the working electrode with respect to the reference electrode (the potential of the working electrode has a positive bias relative to the reference electrode) the conductance value of the contact with or without a delay jumps to the value "zero" and by applying a deposition potential (the potential of the working electrode has a negative bias relative to the reference electrode) the conductance value of the source drain-contact with or without a delay jumps to the intended value G. The described procedure is working in an especially advantageous manner, when the intended on-state-conductance value G is a multiple of the conductance quantum.

By means of a hold-potential, i.e. a value of the potential which is between deposition and dissolution potential, a given conductance value (on-state or off-state) can subsequently be hold constant as long as by changing the potential it will specifically be switched via the deposition potential from the off-state to the on-state or via the dissolution potential from the on-state to the off-state.

Thus the function of a transistor or of a relay on an atomic scale can be implemented. This component is an atomic switch or an atomic relay which can be used as a functional unit for atomic logic switches and logic chips as well as for atomic electronics.

After setting a defined on-state and then setting the cycling and switching and applying a hold-potential only (the value of which may generally also be different for holding the on-state and holding the off-state, see the embodiment described below as an example) this procedure cannot only be used for fabricating and operating of atomic switches and atomic transistors but also for fabricating of a resistor with a pre-selectable value, i.e. with a given value defined before fabrication, which may be preferably an integer multiple of the conductance quantum.

An embodiment of the above described application will be described below. Further embodiments will be described in appendix 1, appendix 2 and appendix 3.

The present invention will be explained further in detail with respect to the following embodiments but is not restricted to them.

FIGURE LEGENDS

FIG. 1(a) is an illustration of the fundamental principal of a metal quantum point contact based switching on an atomic scale. The contacting atoms are moved back and forth by an externally applied gate potential resulting in a gate potential controlled closing and separating of the contact on an atomic scale.

FIG. 1(b) schematically shows the experimental set-up. In this embodiment by applying a gate potential controlled electrochemical deposition potential silver is electrochemically deposited into the nano-scale gap between the gold electrodes (source and drain), while at the same time the conductance is recorded between the gold electrodes by a measuring voltage typically of 12.9 mV. By repeated computer-controlled electrochemical cycling a bi-stable switch on an atomic scale is generated.

Figure 2:
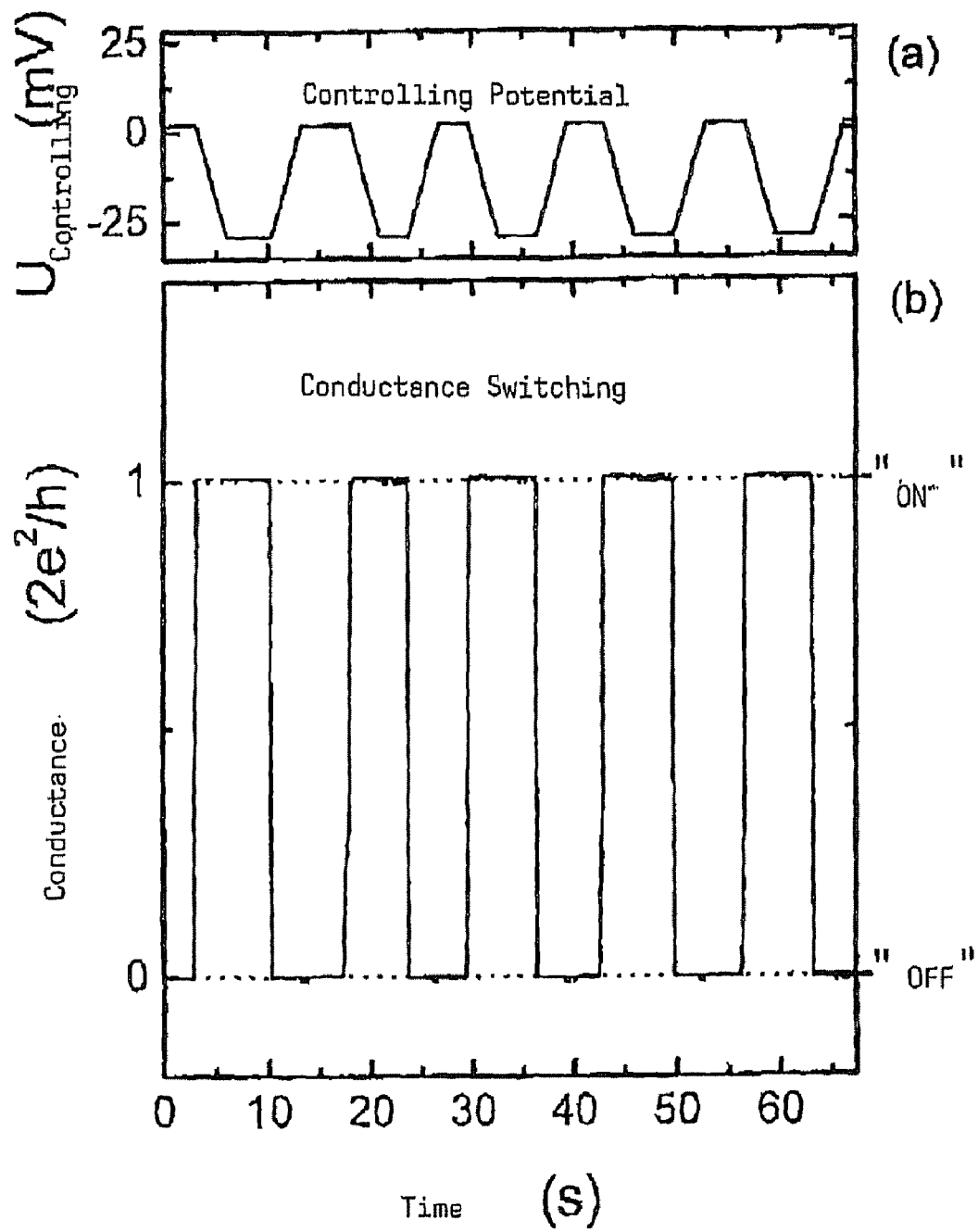

FIG. 2: Switching of the conductance value by means of a control potential $U_{control}$ by varying the control potential (a) the conductance value of the atomic silver contact (b) is switched between a non-conducting off-state and an on-state having a quantized conductance value of 1 $G_0$. The curves are the non-filtered measuring data and show a sharp transition between these two states. This experiment illustrates an atomic switch which is externally controlled by a control potential.

Figure 3:
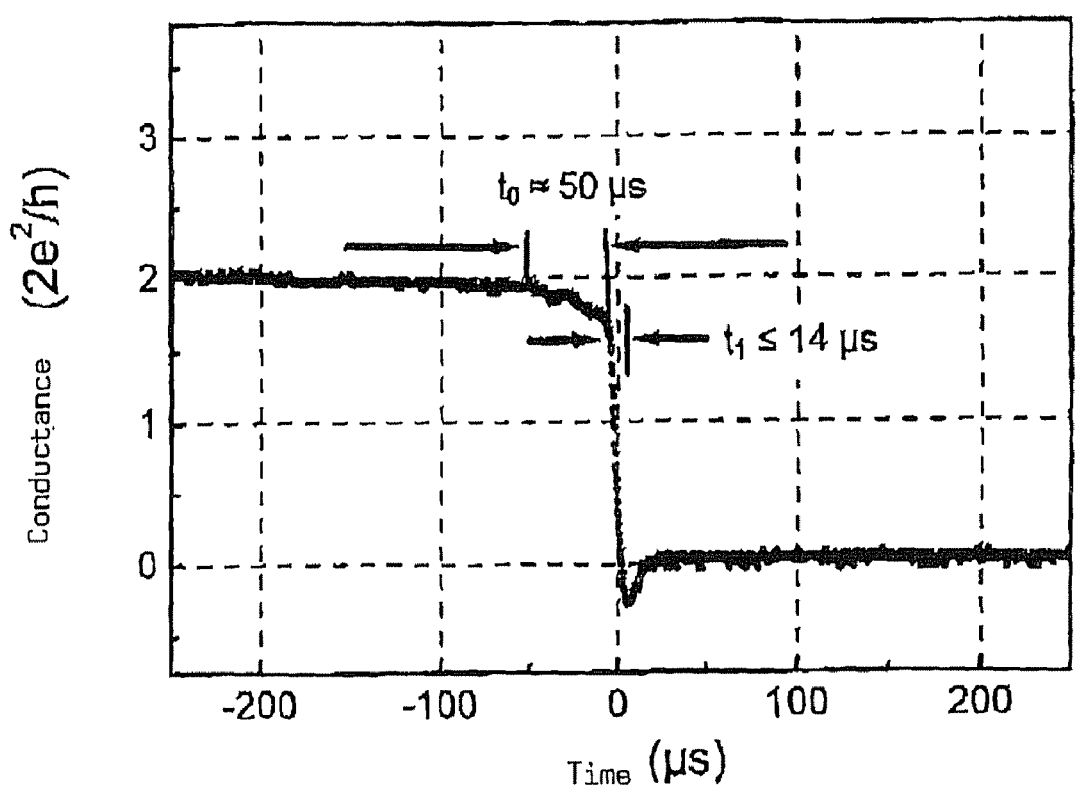

FIG. 3: Time-dependence of the switching process: the figure shows the declining edge of the conductance value as a function of time during the dissolution process of the atomic silver contact. This section is a part of a longer sequence of periodic switch processes between the conductance values of zero and 2 $G_0$. The switching process starts with a pre-phase of about 50 µs which is followed by the intrinsic switching process within a time period of less than 14 µs.

Figure 4:
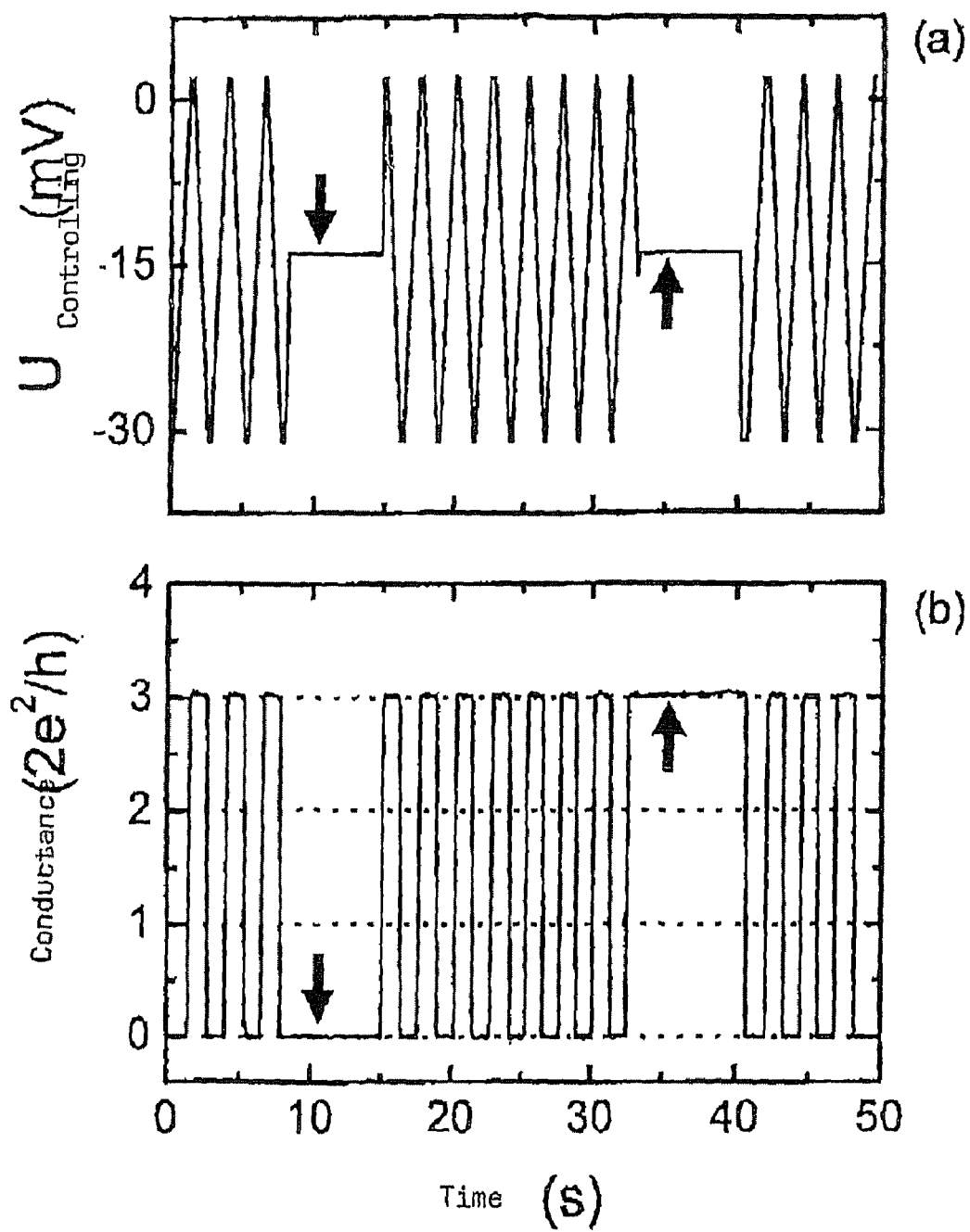

FIG. 4 shows the switching of the conductance value between zero and a pre-selected higher conductance value of 3 $G_0$. The conductance value of the atomic switch (b) is directly controlled by means of the control potential $U_{control}$ (a) which is applied between the electrochemical control electrode and the gold working electrodes. If the control potential is put to a "halt-level" (see arrows), the atomic switch steadily remains on its conductance level.

DETAILED DESCRIPTION OF THE EMBODIMENT

1 Experimental Set-up/Preparation
1.1 Measuring Set-up

FIG. 1 schematically shows the measuring set-up for electrochemical deposition of atomic metallic contacts. There is an electrochemical cell filled with an electrolyte of metallic ions and equipped with potentiostatically controlled electrodes. Two gold electrodes which serve as working electrodes are fixed to a glass substrate and are electrically insulated by a distance between each other of about 100 nm. Both of the gold electrodes are insulated against the electrolyte by means of a polymer coating except for a microscopic area of the contact region.

By applying an electrochemical potential difference between both of the working electrodes and a quasi-reference electrode metal islands (in the present embodiment silver islands) will be deposited on the free area of the gold electrodes. At the same time the conductance between the working electrodes will be recorded. This will be carried out as long as two metal islands which have grown on two different gold electrodes come into contact to each other and will close the gap between both of the gold electrodes in an electrically conducting manner.

1.2 Electrochemical System for Deposition of Silver

For the electrochemical deposition of atomic contacts of silver an electrolyte of an aqueous silver nitrate solution (0.1 mM AgNO$_3$+0.1 M HNO$_3$ dissolved in bi-distilled water) was used. Silver wires of 0.25 mm in diameter with 99.9985% purity serve as quasi-reference electrode and counter electrode.

1.3 Electrochemical Deposition of Atomic Silver Contacts

In order to deposit silver a positive control potential between 2 mV and 40 mV will be applied to the quasi-reference electrode; this will correspond to a deposition potential between −2 mV and −40 mV (each vs. Ag/Ag$^+$) at one of the working electrodes [here it is called gold electrode (1)]. The other working electrode which is called gold electrode (2) is constantly on a potential which is lowered with U$_{measur}$ as compared to the gold electrode (1).

In this embodiment a measurement potential U$_{measur}$ of −12.9 mV was applied. This means that the deposition potential of the gold electrode (2) is 12.9 mV lower than the deposition potential of the gold electrode (1): as the deposition potential of the gold electrode (2) has a negative bias to the electrode (1), tendentially more silver will be deposited on (2).

In order to generate atomic contacts now through applying a positive control potential—that corresponds to applying a deposition potential to the working electrodes—silver will be deposited on both of the electrodes as long as two silver islands get in contact to each other and these islands connect both of the gold electrodes in a conducting manner. This will be checked by a continuous measurement of the conductance value between both of the gold electrodes during the process of deposition of silver. By means of a specially developed computer program the deposition at a given conductance value can be stopped or the contact can be separated by application of a negative control application—that corresponds to applying a dissolution potential to the gold electrodes.

In this manner electrochemically deposited atomic silver point contacts having quantized conductance values can be generated. The measurements are carried out at room temperature. The conductance value of the atomic silver contact was ca. 1 G$_0$. After the deposition of the silver contact the control potential was lowered to −29 mV. [For the sake of clarification, this corresponds to an electrochemical dissolution potential of +29 mV vs. Ag/Ag$^+$ of the gold electrode (1) or of (+29 mV−12.9 mV=16.1 mV) vs. Ag/Ag$^+$ of the gold electrode (2)]. As a consequence of the separation of the contact the conductance value jumps to the value of zero.

After increasing the control potential to +2 mV silver was deposited again on the working electrodes as long as a new contact had been generated and thus the conductance value increased again to the value of 1 G$_0$. Afterwards the deposition was stopped. The deviation of the measured conductance value from the exact value of G$_0$=2e$^2$/h was less than 1% in this case.

2 Atomic Switching 2.1 Specific Atomic Switching

"Training" of Contact Configurations by Cycling

In order to generate bi-stable contacts a procedure was used where an atomic contact was "trained" by several cycles of electrochemical deposition and dissolution, i.e. different contact configurations are generated until a bi-stable configuration appears. For this purpose a computer program was developed by which the corresponding parameters can be preselected and the cycling process can be carried out automatically.

In the following an example will be described for generating a switch between the conductance value of zero and 1 G$_0$. At first an atomic contact was deposited. As soon as the conductance value had reached an upper threshold (in the present case 0.94 G$_0$) which was close to the desired conductance value of the on-state (1 G$_0$) the deposition was stopped and the following computer-controlled cycle was started: by applying a control potential for the dissolution process the contact was separated until the conductance value dropped to a lower limit (off-state, in the present case 0.05 G$_0$). Then a control potential for deposition was applied again until the conductance value exceeded the upper threshold. Afterwards a new dissolution/deposition-cycle was started, and so on.

During the first dissolution/deposition-cycles of a contact which is just being generated anew often fluctuations of the conductance values occur during the different cycles. Normally in the course of time a transition occurs spontaneously from an irregular fluctuation of the conductance value to a control potential controlled switching between two levels (in the present case between the value of zero and the value of 1 G$_0$).

Periodic Switching

FIG. 2 shows an embodiment for a sequence of five switching processes of an atomic switch which was generated by the above described procedure. The atomic silver contact switches between an off-state having a conductance value of zero and an on-state having a conductance value of 1 G$_0$ and is controlled by applying an external electrochemical control potential. This control potential is shown as a function of time in FIG. 2(a), while FIG. 2(b) shows the simultaneously measured conductance value. Each change of the control potential is followed by a switching of the conductance value of the atomic silver contact.

The individual switching processes occur in a very reproducible manner. In the case of the switch shown in FIG. 2 more than 1000 control potential controlled switching processes between the conductance value of zero and G$_0$ could be observed. Furthermore, such switches with several different switches could be reproduced. If 1000 switching processes are evaluated, an accuracy of reproduction of 0.8% (standard deviation) is obtained of the conductance values, which are achieved in the individual switching processes. The noise of the quantized on-state is less than 0.4%. The deviation of the mean value of the measured conductance from the theoretically predicted value of 1 G$_0$ is only 1.0%. The ratio of conductance values of the on- and off-state is limited in such a manner that the conductance value of the off-state is not exactly zero due to electrochemical leakage currents. Depending on the individual configuration of the contact typical ratios between 1000 and 3000 are achieved. The intrinsic switching process of the conductance value does not occur immediately after applying the control potential, but there is a certain delay between the change of the control potential and its effect on the contact. This characteristic time depends on the contact geometry and the ion concentration of the electrolyte and is some seconds for the present experimental set-up.

The intrinsic switching time of the transition, however, is substantially shorter, as FIG. 3 shows. The declining edge of a switching process of a reproducible sequence of transitions between the conductance value of zero and the conductance value of 2 G$_0$ is shown with a time resolution in the μs-range. Initially the conductance value runs almost constantly at 2 G$_0$. The real switching process starts in a pre-phase of about 50 μs (t$_0$ in FIG. 3) during which the conductance value drops to about 1.7 G$_0$ and then the real switching process (t$_1$) occurs.

For the time of the real switching process (t$_1$ in FIG. 3) only an upper limit of 14 μs can be reported due to the low time resolution of the measuring electronics. In further experiments with improved electronics switching processes with a time period of $\leq 3$ μs could be observed. This measured time period, however, is still limited by a time resolution which is still too small. The intrinsic switching velocity may be much higher, as—contrary to other procedures—the only movable parts of the switch are individual atoms and therefore the physical limits of the switching frequencies are in the Tera-Hertz range [17].

Specific Controlling

By means of the just described method of training of an atomic switch configuration not only switches can be produced having conductance values between zero an 1 $G_0$, but also switching processes can be generated between conductance values of zero and other selectable integer multiples of $G_0$. A section of such a generated contact, which switches between the values of zero and 2 $G_0$ was already shown in FIG. 3.

A further embodiment is shown in FIG. 4: What is crucial is the choice of the upper threshold value for the cycles of electrochemical deposition and dissolution of the contact. If for instance a switch is to be generated between the values of zero and 3 $G_0$, an upper threshold value of almost 3 $G_0$ has to be chosen. As a consequence of the training process a contact is formed the conductance value of which will be switchable between the values of zero and 3 $G_0$ by means of an external control potential (see FIG. 4). The shape of the signal, with which the control potential is applied as a function of time (in this case the shape of a triangle) has no influence on the switching operation of the conductance value which proceeds between two values in a digital manner.

FIG. 4 shows a further possibility to interrupt the periodic switch process and to keep constant a defined conductance level. For this purpose a halt-potential (in the present case −14 mV) is applied, which is chosen in such a manner that at the contact a local electrochemical equilibrium potential is established. This potential has the effect that locally no further electrochemical deposition of atoms or dissolution of the atomic contact occurs and thus the conductance value remains constant as a function of time. FIG. 4 shows this behaviour of the off-state (arrow on the left) and of the on-state (arrow to the right). The atomic switch can therefore by means of controlling by the control potential operate in three different modes: Switching on the current, switching off the current, keeping the at last adopted state. Such a switch is therefore the basis of logic switch elements on an atomic scale.

2.2 Summary of the Experiments for a Bi-stable Switching

Along with the presentation of embodiments a procedure was described for production of a bi-stable atomic switch by means of cycles of electrochemical deposition and dissolution between two threshold values of conductance. These embodiments represent the first atomic switches which are controlled by an external control electrode and in which the only movable elements are individual atoms.

The invention claimed is:

1. A switching element comprising three electrodes: a source electrode, a drain electrode and a gate electrode, said source electrode and said drain electrode being connected to each other by means of a bridge made up of one or several atoms which can be reversibly opened and closed; the opening and closing of the contact between said source electrode and said drain electrode being controllable by a potential applied to said gate electrode.

2. A switching element according to claim 1 wherein said bridge is electrically conducting in an on-state at its narrowest point comprising at least one atom and less than a few atoms, whereby an electrical circuit can be opened or closed through the change of the position of said at least one atom and less than a few atoms in the contact area.

3. A switch element according to claim 1 wherein the electrical conductance of said bridge is settable on a pre-selected value.

4. A switching element according to claim 1 wherein the only movable parts of which are the atoms which connect said source electrode and said drain electrode.

5. A switching element according to claim 1 wherein the only movable part of which is a single atom which connects said source electrode and said drain electrode.

6. A switching element according to claim 1 and further including two or more different metals galvanically deposited into a gap between said source electrode and said drain electrode.

7. A switch comprising three electrodes: a source electrode, a drain electrode and a gate electrode, said source electrode and said drain electrode being connected to each other by means of a bridge made up of one or several atoms which can be reversibly opened and closed; the opening and closing of the contact between said source electrode and said drain electrode being controllable by a potential applied to said gate electrode; and an electrolyte receiving said switching element.

* * * * *